(12) United States Patent
Kirkham et al.

(10) Patent No.: US 9,887,304 B2
(45) Date of Patent: Feb. 6, 2018

(54) H₂S REACTIVE ANNEAL TO REDUCE CARBON IN NANOPARTICLE-DERIVED THIN FILMS

(71) Applicant: Nanoco Technologies, Ltd., Manchester (GB)

(72) Inventors: Paul Kirkham, Lancashire (GB); Cary Allen, Manchester (GB); Stephen Whitelegg, Stockport (GB)

(*) Notice: Subject to any disclaimer, the term of this patent is extended or adjusted under 35 U.S.C. 154(b) by 0 days.

(21) Appl. No.: 14/610,895

(22) Filed: Jan. 30, 2015

(65) Prior Publication Data

US 2015/0221795 A1    Aug. 6, 2015

Related U.S. Application Data

(60) Provisional application No. 61/934,495, filed on Jan. 31, 2014.

(51) Int. Cl.
| | | |
|---|---|---|
| *H01L 31/032* | (2006.01) | |
| *H01L 31/18* | (2006.01) | |
| *H01L 21/02* | (2006.01) | |

(52) U.S. Cl.
CPC .... *H01L 31/0322* (2013.01); *H01L 21/02568* (2013.01); *H01L 21/02601* (2013.01);
(Continued)

(58) Field of Classification Search
None
See application file for complete search history.

(56) References Cited

U.S. PATENT DOCUMENTS

| | | |
|---|---|---|
| 6,127,202 A | 10/2000 | Kapur et al. |
| 7,998,789 B1 * | 8/2011 | Chuang .................. C23C 8/02 |
| | | 257/E21.001 |

(Continued)

OTHER PUBLICATIONS

Hibberd C J et al: "Non-Vacuum Methods for Formation of Cu(In, Ga) (Se, S)2 Thin Film Photovoltaic Absorbers", Progress in Photovoltaics: Research and Applications, John Wiley & Sons, Ltd, Jan. 1, 2009 (Jan. 1, 2009), pp. 1-20, XP001090576, ISSN: 1062-7995, DOI: 10.1002/PIP.914 [retrieved on Sep. 24, 2009] p. 6, left-hand column, paragraph 4, p. 7, left-hand column, paragraph 1.

*Primary Examiner* — Caleb Henry
*Assistant Examiner* — Mounir Amer
(74) *Attorney, Agent, or Firm* — Blank Rome, LLP (57) ABSTRACT

A method for preparing CIGS absorber layers using CIGS nanoparticles on a substrate comprises one or more annealing steps that involve heating the CIGS nanoparticle film(s) to dry the film and possibly to fuse the CIGS nanoparticles together to form CIGS crystals. Generally, at least the final annealing step will induce particle fusion to form CIGS crystals. Reactive gas annealing has been found to facilitate the growth of larger grains in the resulting CIGS absorber layers and lead to improved photovoltaic performance of those layers. It is suspected that the presence of carbon in CIGS nanoparticle films hinders grain growth and limits the size of crystals which can be obtained in CIGS films upon annealing. It has been discovered that exposing the CIGS nanoparticle films to a reactive atmosphere containing sulfur can decrease the amount of carbon in the film, resulting in the growth of larger CIGS crystals upon annealing.

17 Claims, 5 Drawing Sheets

(52) U.S. Cl.
CPC .... *H01L 21/02628* (2013.01); *H01L 31/1864* (2013.01); *Y02E 10/541* (2013.01); *Y02P 70/521* (2015.11)

(56) References Cited

U.S. PATENT DOCUMENTS

| | | |
|---|---|---|
| 8,563,348 B2 | 10/2013 | Harris et al. |
| 8,784,701 B2 | 7/2014 | Pickett et al. |
| 2008/0257201 A1 | 10/2008 | Harris et al. |
| 2009/0139574 A1 | 6/2009 | Pickett et al. |
| 2009/0320916 A1* | 12/2009 | Yuan ................ C23C 18/08 136/256 |
| 2012/0100661 A1 | 4/2012 | Choe et al. |
| 2013/0065355 A1* | 3/2013 | Liang ................ H01L 31/0749 438/95 |
| 2013/0157407 A1* | 6/2013 | Liu ................ C23C 14/5866 438/95 |
| 2013/0269778 A1* | 10/2013 | Yang ................ H01L 21/02491 136/262 |
| 2014/0202870 A1* | 7/2014 | Bhattacharya ........... C25D 5/10 205/162 |
| 2014/0251435 A1* | 9/2014 | Ho ................ H01L 31/0326 136/264 |

\* cited by examiner

H₂S REACTIVE ANNEAL TO REDUCE CARBON IN NANOPARTICLE-DERIVED THIN FILMS

CROSS-REFERENCE TO RELATED APPLICATIONS

This application claims the benefit of U.S. Provisional Application No. 61/934,495 filed on Jan. 31, 2014

STATEMENT REGARDING FEDERALLY SPONSORED RESEARCH OR DEVELOPMENT

Not Applicable

BACKGROUND OF THE INVENTION

1. Field of the Invention

The present invention generally relates to thin film photovoltaic devices. More particularly, it relates to copper indium gallium diselenide/disulfide (CIGS)-based thin film photovoltaic devices.

2. Description of the Related Art Including Information Disclosed Under 37 CFR 1.97 and 1.98

Photovoltaic cells offer one of the most promising alternatives to energy generated from fossil fuels. To achieve commercial viability, photovoltaic cells must be fabricated inexpensively using low-cost materials and exhibit moderate-to-high efficiency in the conversion of sunlight to electricity. Additionally, for a device-manufacturing method to succeed commercially, the methods used to synthesize the material must be scalable.

The most common material used in modern photovoltaic devices is silicon. However, silicon is inflexible, expensive, and a relatively poor absorber of light. Therefore, many thin film bulk semiconductor materials have been proposed as potential replacements for silicon, for example, Cadmium Telluride, Copper Indium Gallium Sulfide (Selenide), and Amorphous Silicon. Among these, Copper Indium Gallium Sulfide (Selenide) ($Cu_X In_Y Ga_Z S_A Se_B$), also generically known as CIGS, is widely considered a promising substitute for silicon as a photoactive absorber in photovoltaic devices.

Currently, most techniques for manufacturing CIGS involve high vacuum techniques such as evaporation or sputtering. These techniques are not ideal for high-throughput operations, because they involve high-vacuum chambers, which are limited in size and difficult to implement in a high-throughput manner. As a result, it is difficult to manufacture CIGS films on large and/or on oddly shaped substrates using those techniques.

One promising alternative method for producing thin CIGS layers is by nanoparticle sintering. This technique involves making a solution or ink from nanoparticles of CIGS precursor materials and depositing layers of the ink on a substrate using one of a variety of film-forming techniques. The deposited layers are then annealed to remove solvents and other ink components from the films and to melt the nanoparticles together to yield a CIGS semiconductor layer.

The nanoparticle components of CIGS ink include nanoparticles of CIGS Precursors—copper, indium and/or gallium, and sulfur and/or selenium. Nanoparticles may include one or more of the components in a single nanoparticle. For example, nanoparticles include Cu, In, and Se to provide a $CuInSe_2$ layer. Alternatively, the ink may contain several different types of nanoparticles, which combined provide the desired components. For example, the ink may contain nanoparticles of Cu and In and other nanoparticles of Cu and Se which, when combined, provide $CuInSe_2$.

For CIGS nanoparticles to be useful as a starting material for photovoltaic thin films, they should possess a number of properties. Primarily, the nanoparticles must be small—ideally on the order of a few nanometers to a few hundred nanometers in diameter. Such small particles pack closely together, enabling them to coalesce more easily upon melting. Secondly, a narrow size distribution is favored to ensure that all of the nanoparticles melt at approximately the same temperature, thereby ensuring that the resulting thin film is homogeneous and of a high quality. Thirdly, it is preferred that the nanoparticles are capped with a volatile organic capping agent. Such capping agents are typically needed to help solubilize the nanoparticles in the organic solution used to deposit the nanoparticles on the substrate. It is preferred that the capping ligands be highly volatile so that they can be efficiently removed when the films are annealed. Finally, the melting temperature of the nanoparticles should be lower than the corresponding bulk material, allowing the use of lower processing temperatures.

There are a number of techniques currently used to prepare CIGS nanoparticles. Nanoparticles can be produced using colloidal methods, solvothermal methods, sonochemical methods and ball milling of bulk copper selenide.

The processes disclosed herein may be implemented with CIGS nanoparticles made using any method. However, colloidal methods are particularly promising. Colloidal methods typically involve high-temperature (>250° C.) syntheses to form nanoparticles capped with trioctylphosphine oxide (TOPO) or amines, such as "hot-injection" techniques. Hot-injection relies on the injection of small volumes of precursors into a large volume of solvent at elevated temperature. The high temperature causes breakdown of the precursors, initiating nucleation of the nanoparticles. The temperature of the reaction mixture is subsequently lowered to support nanoparticle growth over a certain period of time before quenching with a suitable organic solvent. Other methods of colloidal nanoparticle synthesis are disclosed in U.S. Patent Publication No. 2009/0139574 A1, and U.S. Pat. No. 8,563,348.

Once nanoparticles are prepared and isolated, they can be formulated into inks, which may be applied to substrates to form films. Such inks are typically solutions or suspension of the nanoparticles in an organic solvent, such as toluene, isophorone, propanol, etc. Surface-bound ligands on the nanoparticles facilitate dispersion/suspension of the nanoparticles in the ink and prevent the nanoparticles from agglomerating. The inks may also contain additional components, such as preservatives, flow or viscosity enhancers, and the like.

Films of CIGS inks can be formed on substrates using a variety of film-forming techniques, such as printing or spraying processes, spin coating, doctor blading, and the like. Once formed, the films are typically heated to expel the organic components of the film and to sinter the nanoparticles, providing a CIGS semiconductor layer.

It has been observed that removal of organic components from the film is important for obtaining high performance CIGS semiconductor layers. The presence of organic components in the film during the sintering process is believed to limit the growth of semiconductor grains. Smaller grains increase the number of grain boundaries within the resulting semiconductor layer and have an adverse effect on performance of the film. Thus, there is a need in the art for improved methods and systems of removing organic components of CIGS films during sintering.

BRIEF SUMMARY OF THE INVENTION

The invention provides systems and methods for preparing CIGS absorber layers for photovoltaic devices by depositing and annealing films of CIGS nanoparticle precursors. An advantage of the disclosed methods is that they result in enhanced removal of carbon components from the films and provide better device performance. The disclosed methods involve annealing deposited CIGS nanoparticle films in a reactive $H_2S$ atmosphere and/or in an atmosphere containing a mixture of $H_2S$ and $H_2Se$.

DETAILED DESCRIPTION OF THE INVENTION

As used herein, the term CIGS refers to materials containing group 11, group 13 and group 16 elements. Generally, CIGS materials have the formula $Cu(In,Ga)(S,Se)_2$. Note that the stoichiometry may vary. Note also that "CIGS" can refer to such a material even if no Ga is present, for example, $CuInS_2$. As used herein, the term CIGS nanoparticle ink refers to an ink containing nanoparticles that provide the components of a CIGS material.

Figure 1:
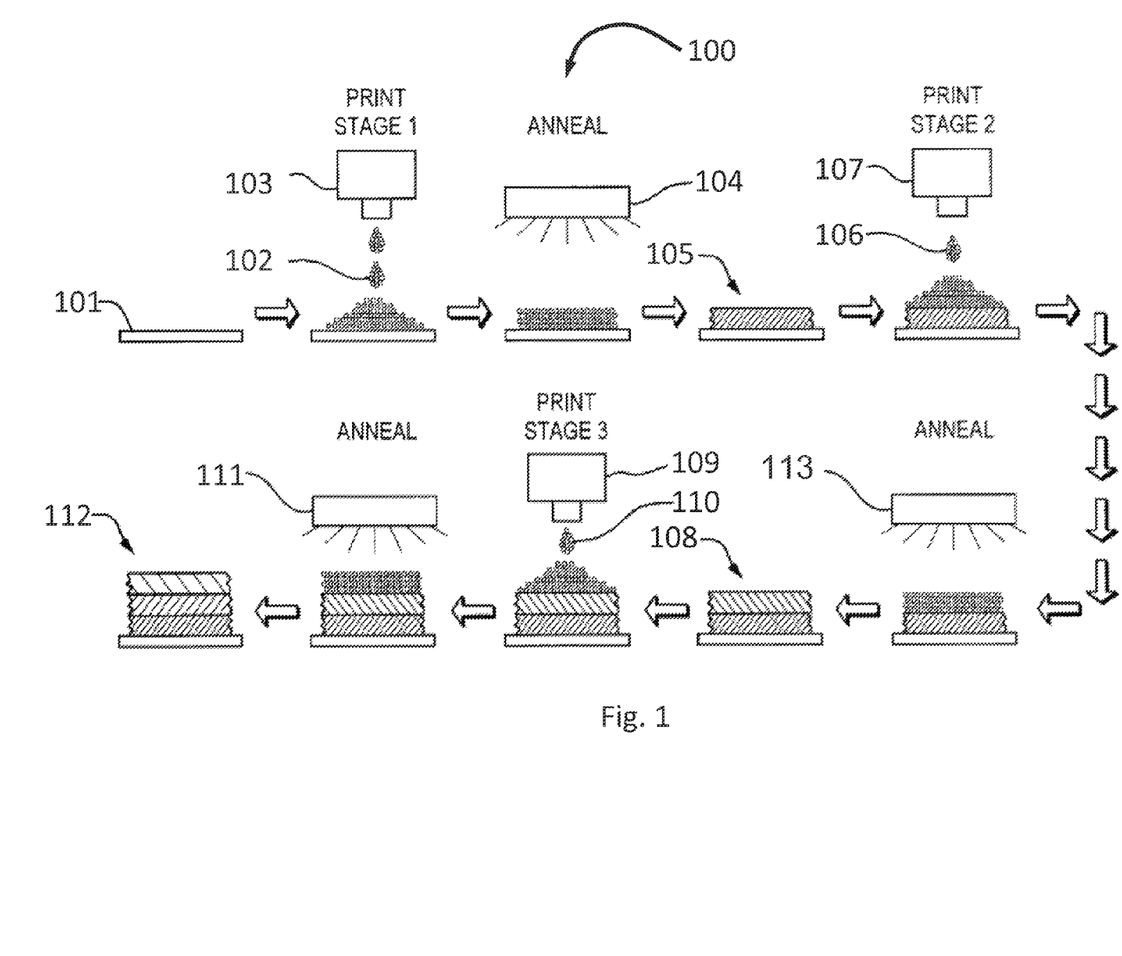
FIG. 1 is a schematic illustration of a method of depositing and annealing films of CIGS nanoparticles to provide a CIGS semiconductor layer.

FIG. 1 schematically illustrates the general method 100 of preparing CIGS absorber layers using CIGS nanoparticles on a substrate 101. A person of skill in the art will appreciate that many types of substrates can be used to make a photovoltaic cell. One example of a substrate is molybdenum-coated glass, as is known in the art.

A first CIGS nanoparticle ink 102 is printed onto substrate 101 using printer 103. CIGS nanoparticle ink 102 is generally an organic solvent suspension containing nanoparticle CIGS precursors, i.e., containing at least one group 13 material (generally indium and/or gallium), a group 11 material (generally copper), and a group 16 material (generally sulfur and/or selenium). All of the CIGS precursors may be provided in a single species of nanoparticle, i.e., as nanoparticles having the general formula $Cu(In, Ga)(S,Se)_2$. Alternatively, the CIGS precursors may be provided as components of two or more types of nanoparticles, each providing one or more CIGS components. An example is ink containing $CuSe_2$ and $InSe_2$ nanoparticles to provide the components of a $CuInSe_2$ CIGS layer.

The methods described herein can be used to form films of CIGS nanoparticles prepared in any of a number of ways. Methods to generate CIGS nanoparticles with uniform size and established stoichiometry are disclosed in U.S. Patent Publication No. 2009/0139574 A1, and U.S. Pat. No. 8,563,348, both of which are hereby incorporated by reference in their entireties.

The nanoparticles are dispersed in an ink, which allows accurate, customizable, and efficient printing of thin layers of material. The ink generally includes one of more organic compounds, such as an aromatic compound, an aliphatic compound, and/or a selenol or thiol compound. Often, the ink includes toluene and dodecane. According to certain embodiments, the resulting ink formulation may include up to around 50% w/v of nanoparticles, although the w/v percentage can be adjusted. Additionally, elastomers or binders may be added to the inks to influence the coating properties of the material.

Printer 103 can be any printer known in the art that can be adapted to disperse the CIGS nanoparticle ink. Examples include dot matrix printers, ink jet printers, and the like. Moreover, while Print Stage 1 is illustrated as employing a printer in FIG. 1, other techniques of applying films can be used. Examples of such techniques include spin coating, evaporative coating, doctor blading, drop coating, and any other technique known in the art for applying organic thin films.

Following film deposition, the deposited CIGS nanoparticle film is annealed at annealing stage 104 to produce CIGS layer 105. Annealing step 104 generally involves heating the CIGS nanoparticles film to a temperature and time sufficient to dry the film. Annealing step 104 may also result in fusing of the nanoparticles to form CIGS crystals. The annealing stages will be described in more detail below. But it should be noted that the process generally contains at least one annealing step that fuses the nanoparticles to form crystals.

Next, CIGS nanoparticle ink 106 is applied in a Print Stage 2 using printer 107. Printer 107 may be the same printer 103, which is simply reused for Print Stage 2, or printer 107 may be a distinct piece of equipment. Likewise, CIGS nanoparticle ink 106 may be the same ink formulation as 102 or may be a different formulation. The same formulation may be applied as multiple layers to provide a thicker film. Alternatively, ink formulations 102 and 106 may differ so as to provide an absorber layer with a varying composition as a function of position within the absorber layer. For example, U.S. Pat. No. 8,563,348 describes using multiple CIGS layers to provide an absorber layer, wherein the ratio of In to Ga varies as a function of depth within the absorber layer.

Following Print Stage 2, the film is annealed in a second anneal stage 113 to form double layer film 108. Note that film 108 is depicted as having two distinct layers for clarity only; in practice there may not (and often preferably will not) be a layer boundary.

Method 100 may include additional Print Stage 3 which uses printer 109 to apply additional layers of CIGS nanoparticle ink 110 and additional anneal stage 111. FIG. 1 illustrates a three-stage process, but the number of stages can be one up to essentially any number, depending on the thickness and composition of the desired finished product. The ultimate product of method 100 is absorber layer 112.

The disclosed method relates to the one or more annealing steps 104, 107, and 111 illustrated in FIG. 1. One or more of the annealing steps may be practiced according to the process now to be discussed. As mentioned above, annealing involves heating the CIGS nanoparticle film(s) to dry the film and possibly to fuse the CIGS nanoparticles together to form CIGS crystals. Generally, at least the final annealing step will induce particle fusion to form CIGS crystals.

The film may be heated with any suitable heat source, e.g., an oven, vacuum oven, furnace, IR lamp, laser, or hot plate. Annealing times and temperatures may depend on nanoparticle sizes and compositions as well as ink composition.

Such parameters may be obtained without undue experimentation. Annealing temperatures are generally above 200° C. Annealing temperature may be controlled according to a temperature ramp, whereby the temperature is changed from a first temperature to a second temperature at a given rate of change, held at the second temperature for a length of time and then changed to a third temperature, and so on. Example temperature ramps are disclosed in U.S. Patent Publication No. 2009/0139574.

Annealing may be conducted under static or a dynamic atmosphere. According to one example, annealing is performed using a tube furnace under a flowing atmosphere of a chosen gas.

U.S. Patent Publication No. 2009/0139574 describes annealing under both static and dynamic inert atmospheres, such as nitrogen. However, reactive atmospheres can also be used. For example, Se tends to be ejected from films during annealing. Se-containing films may therefore be annealed under a Se-containing atmosphere, such as $H_2Se$, to maintain or adjust the concentration of Se in the film. Also, Se can replace S in films during annealing by annealing S-containing films under a Se-containing atmosphere. It has been found that use of a Se-containing atmosphere to anneal S-containing films aids the formation of large grains in the film because the volume of the film expands when Se replaces S atoms. The extent of volume expansion is about 14%.

Reactive gas annealing has been found to facilitate the growth of larger grains in the resulting CIGS absorber layers and lead to improved photovoltaic performance of those layers. It is suspected that the presence of carbon in CIGS nanoparticle films hinders grain growth and limits the size of crystals which can be obtained in CIGS films upon annealing. Potential sources of such carbon are the solvent(s) used to form the CIGS nanoparticle inks, other components in the ink, such as elastomers, binders, viscosity modifiers, and the like, as well as ligands bound to the surfaces of the nanoparticles.

The inventors have discovered that exposing the CIGS nanoparticle films to a reactive atmosphere containing sulfur can decrease the amount of carbon in the film, resulting in the growth of larger CIGS crystals upon annealing. According to one embodiment, one or more of the annealing steps illustrated in FIG. 1 are conducted under a reactive sulfur-containing atmosphere, such as $H_2S$. The CIGS nanoparticle film typically contains one or more types of nanoparticles providing the overall composition Cu(In and/or Ga)(S and/or Se)$_2$. It will be noted that annealing a S-containing or a Se-containing film in a S-containing atmosphere is counterintuitive. It is more typical to anneal those types of films in a Se atmosphere. Following annealing under a reactive Se-containing atmosphere, the films are annealed in an S-containing atmosphere.

Reactively removing carbon from the CIGS nanoparticle films provides larger CIGS crystals and at lower annealing temperatures than required for crystal formation in carbon-containing films. The annealing temperature may below 500° C., below 480° C., or below 460° C. Lower-temperature processing provides several advantages. For example, at lower temperatures, CIGS absorber layers may be grown on flexible substrates such as polymers, which would not withstand higher temperature processing. Also, lower-temperature processing prevents the formation of species such as MoSe, which act as a failure mode.

It will be appreciated that the reactive sulfur annealing may be implemented as part of any of the annealing steps illustrated in FIG. 1. In other words, one or more layers and/or the complete CIGS absorber layer may be annealed in the presence of reactive sulfur.

According to another embodiment, one or more annealing stages are conducted in a mixture of a S-containing gas and a Se-containing gas. Reactive annealing using $H_2Se$ followed by $H_2S$ results in an increased open circuit voltage (Voc) and a coincident decrease in short circuit current (Jsc). Reactive annealing in a mixture of $H_2S$ and $H_2Se$ within the film increases the fill factor and power conversion efficiency (PCE) of the films.

Figure 2:
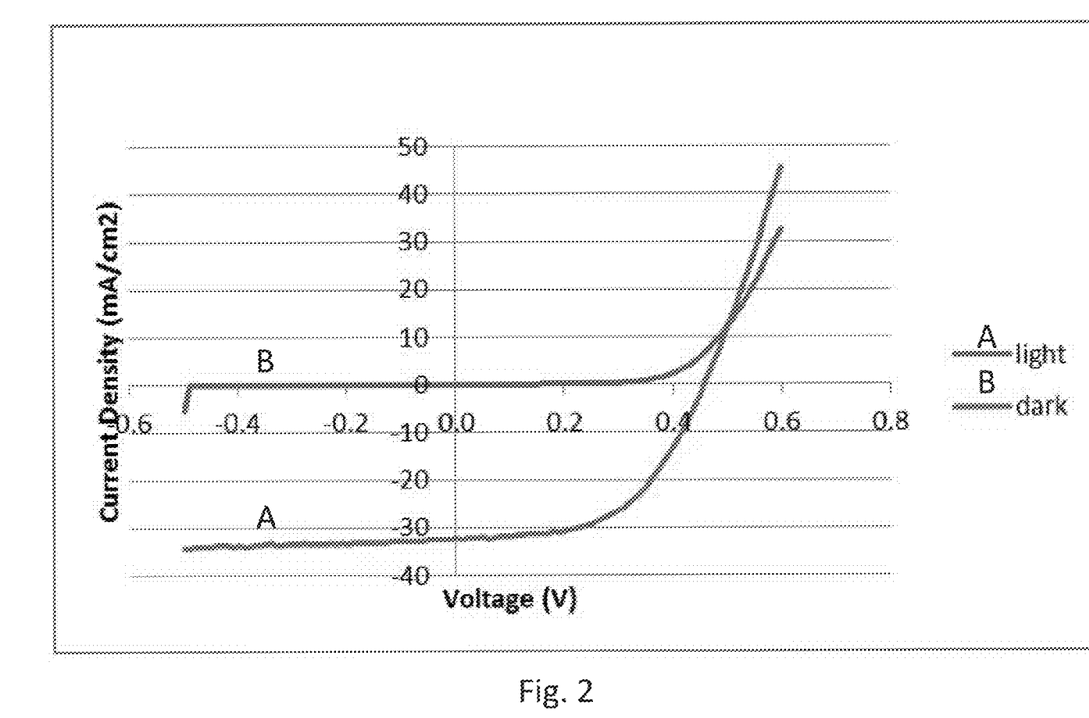
FIG. 2 is an I-V curve of a photovoltaic device prepared by depositing CIGS nanoparticles and annealing the films in a $H_2S$ atmosphere.

FIG. 2 shows a current-voltage plot of a device using an absorber layer formed by depositing a film using a CIGS nanoparticle ink and annealing the film in a $H_2Se$ atmosphere. The device exhibits a Voc of 0.46 V, a Jsc of 32.4 mA/cm$^2$, a fill factor of 53 and a PCE of 8.1%.

Figure 3:
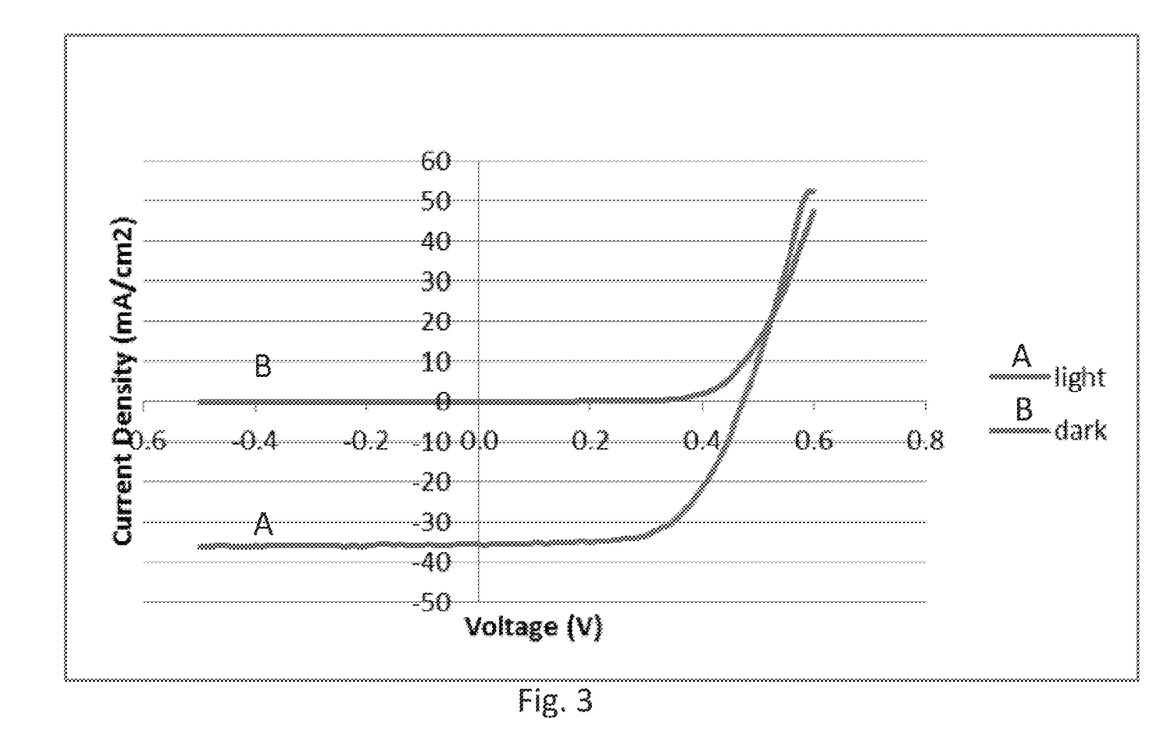
FIG. 3 is an I-V curve of a photovoltaic device prepared by depositing CIGS nanoparticles and annealing the films in an $H_2S$ and $H_2Se$ atmosphere.

FIG. 3 shows a plot for device prepared in a similar manner except that the film was annealed in a mixture of $H_2S$ and $H_2Se$. The device of FIG. 3 exhibits a Voc of 0.48 V, a Jsc of 35.7 mA/cm$^2$, a fill factor of 61.1 and a PCE of 10.6%. Compared to the baseline device, the Jsc has increased from 32.4 mA/cm$^2$ to 35.7 mA/cm$^2$ and the FF has increased significantly from 53 to 61.1, resulting in a device PCE of 10.6%.

Table 1 shows data for device singularization for the device used to generate the plot illustrated in FIG. 3. The table shows increasing fill factor (FF) for decreased surface area of the device. As the device is singularized (by decreasing the incident surface area) the FF increases to 68.3 and an efficiency of 11.0%. The values are comparable to values quoted in the literature for devices made using vacuum processes.

TABLE 1

| Device area (cm$^2$) | Voc (V) | Jsc (mA/cm$^2$) | FF | PCE (%) |
| --- | --- | --- | --- | --- |
| 0.2 | 0.49 | 34.2 | 61.4 | 10.6 |
| 0.1 | 0.47 | 34.4 | 66.8 | 11.0 |
| 0.05 | 0.46 | 34.3 | 68.3 | 11.0 |

Figure 4:
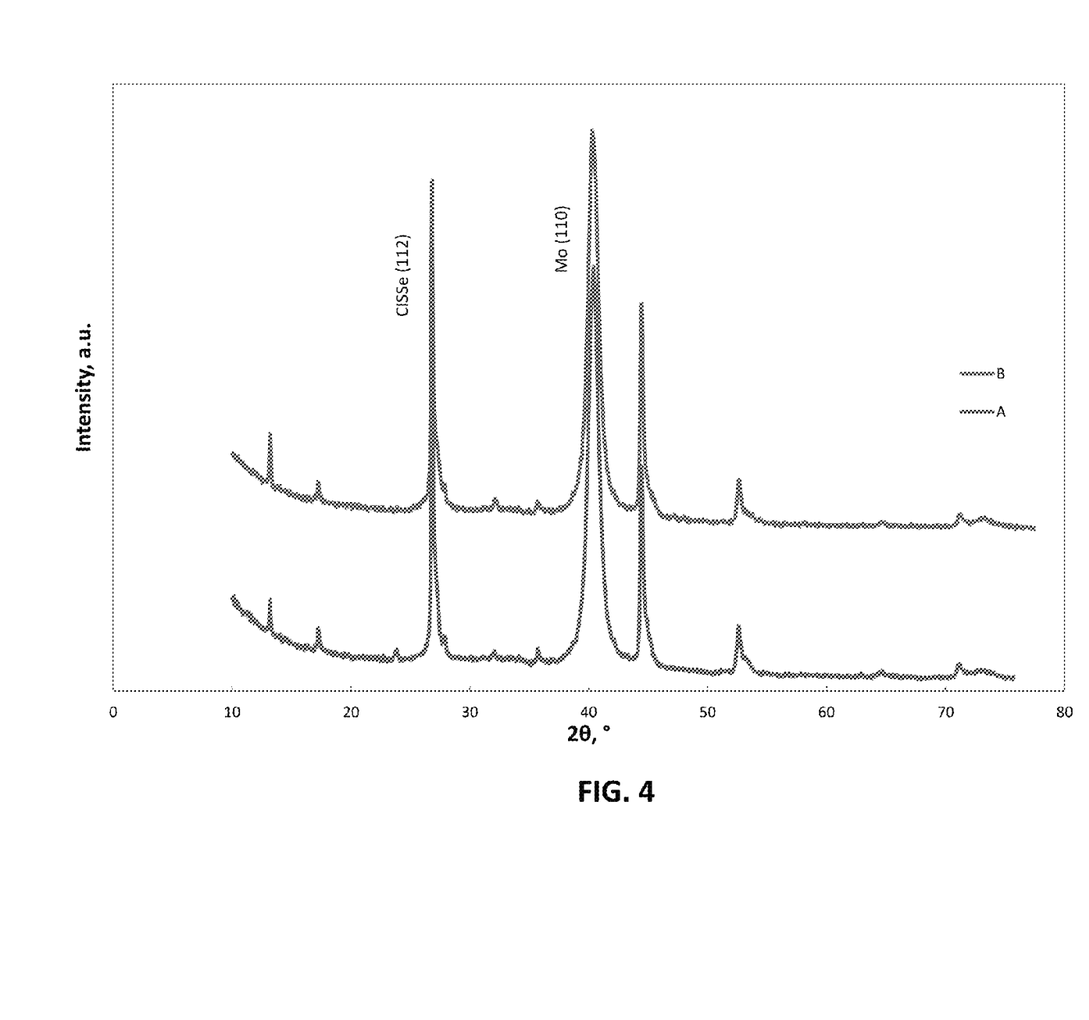
FIG. 4 shows XRD spectra of the CIGS layers of the devices used to generate the I-V curves of FIGS. 2 and 3.
Figure 5:
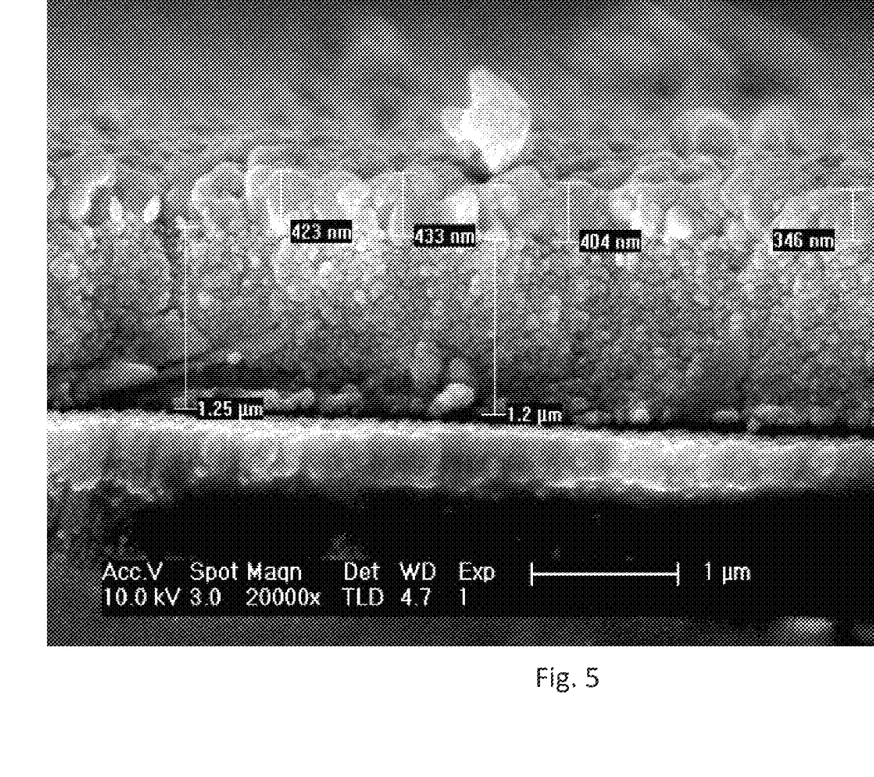
FIG. 5 is an SEM image of the CIGS layer of the device used to generate the I-V curve of FIG. 3.

FIG. 4 shows XRD spectra of the films annealed in $H_2Se$ (A) and in $H_2S/H_2Se$ (B). The compositions of the films are very similar and mainly correspond to CuInSe$_2$. The similarity of the films indicates that the gains in FF are not a result of the chemical composition of the film, but instead relate to the quality of the film. SEM images of the $H_2S/H_2Se$-annealed film indicate significant grain growth. An example SEM image of the film is shown in FIG. 5.

The foregoing description of preferred and other embodiments is not intended to limit or restrict the scope or applicability of the inventive concepts conceived of by the Applicants. It will be appreciated with the benefit of the present disclosure that features described above in accordance with any embodiment or aspect of the disclosed subject matter can be utilized, either alone or in combination, with any other described feature, in any other embodiment or aspect of the disclosed subject matter. Although particular embodiments of the present invention have been shown and described, they are not intended to limit what this patent covers. One skilled in the art will understand that various changes and modifications may be made without departing from the scope of the present invention as literally and equivalently covered by the following claims.

What is claimed is:

1. A method for preparing a film containing Copper Indium Gallium Sulfide (Selenide) [CIGS] nanoparticles comprising:

depositing a solution or suspension of CIGS precursors in an organic solvent onto a substrate to form a film;

annealing the film in a reactive selenium-containing atmosphere;

annealing the film in a reactive sulfur-containing atmosphere after annealing in the reactive selenium-containing atmosphere; and reactively removing carbon from the film while annealing the film in the reactive sulfur-containing atmosphere.

2. The method recited in claim 1 wherein the reactive sulfur-containing atmosphere comprises hydrogen sulfide gas ($H_2S$).

3. The method recited in claim 1 wherein the reactive sulfur-containing atmosphere further comprises selenium.

4. The method recited in claim 1 wherein the reactive selenium-containing atmosphere comprises hydrogen selenide gas ($H_2Se$).

5. The method recited in claim 1 wherein the CIGS precursors comprise copper, indium and/or gallium, and sulfur and/or selenium.

6. The method recited in claim 1 wherein the substrate comprises glass.

7. The method recited in claim 6 wherein the glass is molybdenum-coated glass.

8. The method recited in claim 1 wherein the annealing in the reactive sulfur-containing atmosphere is performed at a temperature greater than about 200° C.

9. The method recited in claim 1 wherein the annealing temperature is varied during the annealing in the reactive sulfur-containing atmosphere.

10. The method recited in claim 9 wherein the annealing temperature is changed from a first temperature to a second temperature at a selected rate of change.

11. The method recited in claim 10 further comprising holding the annealing temperature at the second temperature for a selected period of time and then changing the annealing temperature to a third temperature.

12. The method recited in claim 1 wherein the time and temperature of the annealing is sufficient to induce particle fusion to form CIGS crystals.

13. The method recited in claim 1 wherein the annealing is performed in a tube furnace.

14. The method recited in claim 1 wherein the substrate is a polymer and the annealing in the reactive sulfur-containing atmosphere is performed at a temperature below about 500° C.

15. The method recited in claim 14 wherein the substrate is a polymer and the annealing in the reactive sulfur-containing atmosphere is performed at a temperature below about 460° C.

16. The method recited in claim 1 further comprising additional depositing and annealing steps to form a multi-layer film.

17. The method recited in claim 16 wherein a ratio of indium to gallium in the multi-layer film varies as a function of depth within the film.

* * * * *